United States Patent [19]
Kiriyama et al.

[11] Patent Number: 5,907,298
[45] Date of Patent: May 25, 1999

[54] INTERPOLATION CIRCUIT FOR ENCODER

[75] Inventors: Tetsuro Kiriyama; Mikiya Teraguchi, both of Kawasaki, Japan

[73] Assignee: Mitutoyo Corporation, Kawasaki, Japan

[21] Appl. No.: 08/949,620

[22] Filed: Oct. 14, 1997

[30] Foreign Application Priority Data

Oct. 29, 1996 [JP] Japan ................................. 8-286847

[51] Int. Cl.[6] .................................................. G01D 5/00
[52] U.S. Cl. ........................... 341/111; 341/116; 318/602
[58] Field of Search .................................. 341/111, 116; 318/600, 661, 602

[56] References Cited

U.S. PATENT DOCUMENTS

| | | | |
|---|---|---|---|
| 3,623,072 | 11/1971 | Pohlman et al. ....................... | 341/111 |
| 4,164,729 | 8/1979 | Simon et al. ........................... | 341/116 |
| 4,375,636 | 3/1983 | Stack et al. ............................ | 341/116 |
| 5,650,779 | 7/1997 | Sugden ................................... | 341/9 |

FOREIGN PATENT DOCUMENTS

A-8-286847  11/1996  Japan .

Primary Examiner—Howard L. Williams
Assistant Examiner—Peguy JeanPierre
Attorney, Agent, or Firm—Oliff & Berridge, PLC

[57] ABSTRACT

An interpolation circuit of an encoder of which dynamic accuracy is improved is disclosed. The phase angle data detecting circuit 1 detects to store the phase angle data PH for each of the first clock CK1. The phase angle data PH is input to the updating circuit 2 in which the current data CNT is subtracted from the subsequent phase angle data PH so as to be updated. The differential data DX is limited within an upper limit to be added to the current data CNT. The integrating circuit 3 integrates the differential data DELTA1, whose upper limit is predetermined, by the second clock CK2 to generate the carry signal QUADEN at each timing when the integrated value leads to the period ratio of CK1 to CK2. The two-phase square wave generating circuit 5 generates two-phase square wave signals at each timing of the carry signal QUADEN. The over-speed detecting circuit 6 monitors the differential data DX to generate the over-speed alarm signal OSALM under a predetermined condition.

8 Claims, 10 Drawing Sheets

INTERPOLATION CIRCUIT FOR ENCODER

BACKGROUND OF THE INVENTION

1. Field of the Invention

The present invention relates to an encoder which detects position, angle, velocity, angular velocity and the like, especially relates to an interpolation circuit which performs a digital interpolation processing for two-phase sinusoidal signals output from the encoder, thereby outputting two-phase square wave signals with a shorter period than the sinusoidal signals.

2. Prior Art

The grating period of an encoder scale is limited by processing technology. Therefore, in order to achieve a higher revolution than the scale grating, it is necessary to divide and interpolate the spatial phase period of the sinusoidal signal output from the encoder. Various interpolation circuits are currently used.

FIG. 11 shows an example of conventional digital interpolation circuits. The encoder 40 comprises a scale 40a and a read head 40b which is disposed relatively movable to the scale 40a. The read head 40b outputs two-phase sinusoidal signals INA and INB (i.e., A-phase and B-phase signals) corresponding to the relative movement of the scale 40a and the head 40b, which are 90° phase-shifted with each other. The two-phase sinusoidal signals INA and INB are sampled by sample-and-hold circuits 41a and 41b to which a first clock CK1 is supplied, and the resulting sampled values are input to A/D converter 42a and 42b to be converted to digital data DA and DB, respectively. The digital data DA and DB are input to a look-up table memory 43, whereby phase angle data PH, each of which corresponds to the respective sampling phase, are read out from a look-up table memory 43. The phase angle is defined as the following inverse tangent function (ATAN) of the ratio between DA and DB.

$$PH = ATAN\,(DA/DB) \qquad (1)$$

The correlation between the phase angle data PH and the two-phase sinusoidal signals INA and INB is shown in FIG. 12. The phase angle data PH obtained from the memory 43 are sequentially stored in a register 44, and then transferred to a register 45. A subtracter 46 calculates a differential between the phase angle data and one clock period preceding phase angle data in these registers 44 and 45 to output a differential data DX. The differential data DX is used as interpolation timing pulses for a two-phase square wave generating circuit 47. The two-phase square wave generating circuit 47 is driven by a second clock CK2, which is synchronized with the first clock CK1 and has a higher frequency than the first clock CK1, thereby outputting two-phase square wave signals OUTA and OUTB, state changes of which are synchronized with the differential data DX.

The two-phase square wave generating circuit 47 selects a state transition between four phase (0,0), (1,0), (1,1) and (0,1) for the combination (A,B) of the two-phase square wave signals OUTA and OUTB, based on the polarity and the absolute of the differential data DX, so as to output the two-phase square wave including the information of direction of the scale movement. The state transition is shown in FIG. 13. When the phase angle data PH is increasing (i.e., the differential data DX is positive), the state changes in the "UP" direction shown in FIG. 12 in such a manner of; (0,0)→(1,0)→(1,1)→(0,1). While, when the deferential data DX is negative, the state changes in the "DOWN" direction in such a manner of; (0,0)→(0,1)→(1,1)→(1,0). As a result of the above-described state change, digital two-phase square wave signals are generated.

FIG. 14 shows a schematic diagram of the two-phase square wave signals OUTA and OUTB in such a case that the differential data DX are 0, 1, 5, and 3 in the respective cycle K−1, K, K+1, and IK+2 of the first clock CK1, respectively. Every rising and falling edges of the two-phase square wave signals OUTA and OUTB correspond to interpolation timing pulses. FIG. 14 shows that an external counter count the rising and falling edges of the two-phase square wave signals.

As described above, the conventional interpolation circuit sequentially output the phase angle data PH by the first clock CK1, and performs increasing/decreasing the differential data DX between each two phase angle data, which are one clock period shifted each other, by the second clock CK2, whereby the two-phase square wave signals OUTA and OUTB, which are interpolated with a divisional number defined by the ratio of periods between the first and second clock CK1 and CK2, can be output.

However, as apparent from FIG. 14, the conventional digital interpolation method has a drawback that the interpolation timing pulses are not uniformly distributed. This is because of that the differential data for each clock period is directly increased/decreased by the second clock CK2 the frequency of which is higher than the first clock CK1. The lack of uniformity of the interpolation timing pulse distribution reduces dynamic accuracy of the encoder. That is, the position measuring precision in real time when the encoder is moving is decreased. Especially, in such a case that it is necessary to output a velocity information based on each position difference for a predetermined period in an NC apparatus, the deterioration of the velocity information is a large problem.

SUMMARY OF THE INVENTION

The present invention provides an interpolation circuit for an encoder with improved dynamic accuracy, in which the lack of uniformity of the interpolation pulse distribution is improved.

Furthermore, the present invention provides an interpolation circuit of an encoder with not only improved dynamic accuracy, but also an over-speed detecting circuit.

The interpolation circuit for the encoder according to the preset invention comprises: a clock generator which generates a first clock and a second clock, the second clock being synchronized with the first clock and having a higher frequency than the first clock; a phase angle detecting circuit which samples two-phase sinusoidal signals output from the encoder with 90° phase-shift each other by the first clock, and then digital-processes the resultant sampled values to detect phase angle of the two-phase sinusoidal signals so as to sequentially output phase angle data, each phase angle data corresponding to the respective sampling phase defined by the first clock; a data updating circuit which sequentially input the phase angle data output from the phase angle detecting circuit, and then updates the current phase angle data by the subsequent phase angle data in such a manner as to calculate a differential between the current phase angle data and the subsequent phase angle data, and then adds the differential data, whose upper limit is predetermined, to the current phase angle data, thereby holding sequentially updated phase angle data; an integrating circuit which integrates the differential data by the second clock to hold the integrated value which is to be reset by the first clock; a carry detecting circuit which detects that the integrated value is over the ratio of the first clock period to the second clock period to output a carry detecting signal; and a two-phase square wave generating circuit which generates digital two-phase square wave signals, state of which changes synchronously with the second clock at each timing of the carry detecting signal.

In a preferred embodiment of the interpolation circuit of the present invention, the phase angle detecting circuit comprises: a sample-and-hold circuits which sample the two-phase sinusoidal signals by the first clock and holds the sampled values; an A/D converters which convert the sampled values to a set of digital data; a look-up table memory which outputs a phase angle data based on the set of digital data; and a first data storing circuit which sequentially stores the phase angle data read out from the look-up table memory synchronously with the first clock.

In the preferred embodiment, the data updating circuit comprises; a second storing circuit which sequentially stores the phase angle as a current phase angle data which is to be updated by the subsequent phase angle data from the first storing circuit synchronously with the first clock; a subtracter which subtracts the current phase angle data in the second storing circuit from the subsequent phase angle data in the first storing circuit to output a differential data; a limiter which limits the differential data so as to have an upper limit that is smaller than the ratio of the first clock period to the second clock period; and an adder which adds the differential data whose upper limit is predetermined to the current phase angle data in the second storing circuit, thereby updating the current phase angle data.

Alternatively, the data updating circuit comprises; a second storing circuit which sequentially stores the phase angle as a current phase angle data which is to be updated by the subsequent phase angle data from the first storing circuit synchronously with the first clock; a subtracter which subtracts the current phase angle data in the second storing circuit from the subsequent phase angle data in the first storing circuit to output a differential data; a detecting circuit which detects the absolute and the polarity of the differential data; a limiter which limits the absolute of the differential data so as to have an upper limit that is smaller than the ratio of the first clock period to the second clock period; a polarity adding circuit which adds the polarity data to the differential data whose maximum is limited; and an adder which adds the differential data on which the polarity data is added to the current phase angle data in the second storing circuit, thereby updating the current phase angle data.

In the preferred embodiment of the present invention, the interpolation circuit further comprises an over-speed detecting circuit which detects over-speed state by monitoring the differential data in the data updating circuit. For example, the over-speed detecting circuit comprises: a comparator which compares the absolute of the differential data with a reference value to output a over-speed signal for each timing when the absolute of the differential data is higher than the reference value; and an alarm circuit which input the over-speed signals synchronously with the first clock to output an over-speed alarm signal in such a condition that the over-speed signals are subsequently output over a predetermined number. Alternatively, the over-speed detecting circuit comprises: a comparator which compares the absolute of the differential data with a reference value to output an over-speed signal for each timing when the absolute of the differential data is higher than the reference value; a polarity detecting circuit which detects the polarity of the differential data; and an alarm circuit which input the over-speed signals synchronously with the first clock to output an over-speed alarm signal in such a condition that the over-speed signals are subsequently output, and thereunder the polarity detecting circuit detects the inversion of the polarity of the differential data.

According to the present invention, phase angle data are subsequently obtained by sampling two-phase sinusoidal signals by use of a digital processing with a first clock, and then differential data between each phase angle data and the subsequent phase angle data are subsequently obtained. Thereafter, time-interpolation processing is performed for the differential data with a second clock which has a higher frequency than the first clock, whereby uniformly dispersed pulses are generated within the first clock period. In detail, differential data between the current phase angle data and the subsequent phase angle data, whose maximum is limited to an upper limit, is added to the current phase angle data, whereby the current data is updated. The differential data, whose upper limit is predetermined, are integrated by the second clock. When the integrated value is over the ratio of the first clock period to the second clock period, a carry detecting signal is output. The two-phase square wave data generating circuit generates two-phase square wave output pulses with state changes corresponding to the timing and the polarity of the carry detecting signal.

As a result of that the upper limit is set for the differential data of the phase angle data, and the integration operation, whose data range is set to the ratio of the first clock period and the second clock period, is performed, the carry detecting signals, the number of which corresponds to the differential data value, are generated at positions defined by integral times the second clock period in such a manner that the larger is the differential data, the smaller is the interval of the carry detecting signals. Therefore, the carry detecting signals are uniformly dispersed within the first clock period, whereby dynamic accuracy of the encoder can be improved.

In the present invention, comparing the first clock for data sampling, the frequency of the second clock is limited by precision of the external counter. Preferably, the frequency of the second clock is set to be as high possible as in the above limit by the external counter. As described above, the number of the interpolation pulses is equal to the ratio of the first clock period and the second clock period. Therefore, preferably, the upper limit of the differential data is also set to be the ratio of the clock periods or less, and the data range for generating the carry signals is set to be the ratio of the clock periods. By such an integration operation as above-described, the interpolation pulses based on the differential data can be uniformly distributed in the first clock period.

Even if the movement velocity of the encoder is limited by specifications, due to the handling way, the encoder velocity may instantaneously become large. Alternatively, instantaneous varying of the two-phase sinusoidal signals may happen. In such cases, the upper limiting of the differential data causes a counting error, because of that the large displacement is neglected. According to the present invention, feedback mechanism is used in the data updating circuit, whereby the interpolation circuit of the present invention can prevent from the counting error. This is because of that although the updated range within one period is limited, the current phase angle data is fed-back for next differential calculation to be updated. Therefore, even if instantaneous and large varying occurs, the current phase angle data can be automatically renewed to a true value. As a result, the error counting of the incremental counter can be prevented.

Furthermore, in the present invention, the absolute detecting circuit can be used to take the absolute of the differential data, which is to be transferred to the integration circuit, in the data updating circuit. In this case, the detecting algorithm in the carry detecting circuit can be the same in spite of that the differential data is positive or negative. As a result, carry detecting, which is to have high speed performance, becomes easy. If such the absolute detecting circuit is not used, although the high speed performance can not be obtained, the circuit scale can be reduced.

The interpolation circuit of the present invention has a tolerance for feed velocity of the encoder due to the circuit construction. Therefore, in the preferred embodiment, the over-speed detecting mechanism is used for monitoring the differential data of the phase angle data so as to alarm the circuit error due to the over-speed. For the over-speed detecting, such conditions can be used that the differential data is over a predetermined reference value, and the over-speed states are subsequently detected synchronously with the first clock until a predetermined number. As a result, such an event that over-speed alarms are frequently output due to a mechanical vibration and the like can be prevented. Then, without disturbing the high-speed performance, it is able to accurately determine the over-speed.

BRIEF DESCRIPTION OF THE DRAWINGS

The preferred embodiments of the present invention will be described in detail, with reference to the following drawings.

DETAILED DESCRIPTION OF THE PREFERRED EMBODIMENTS

Figure 1:
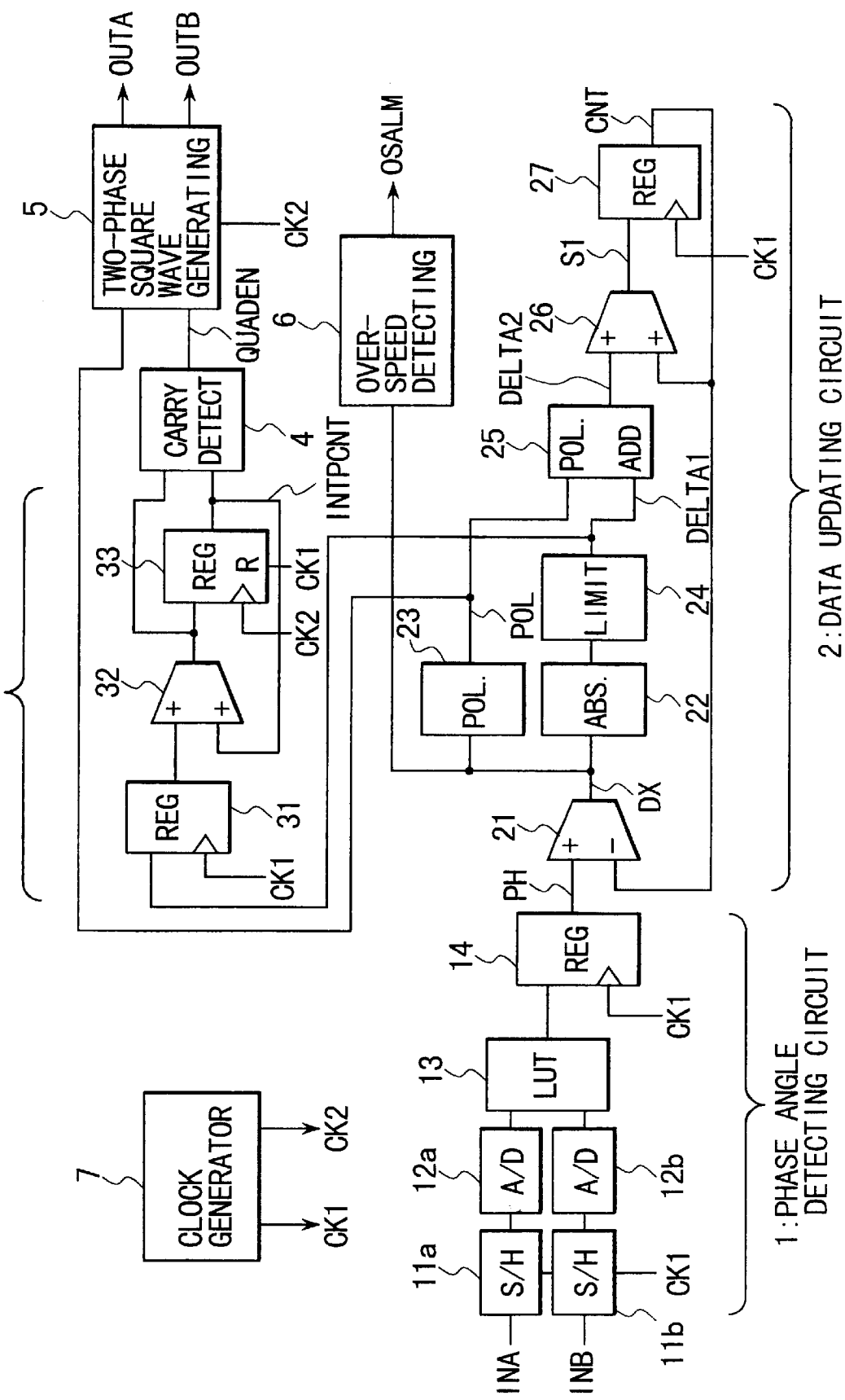
FIG. 1 shows an interpolation circuit according to a preferred embodiment of the present invention.

Referring to FIG. 1, the two-phase sinusoidal signals INA and INB are output signals from an encoder (not shown). The encoder is, for example, a magnetic encoder which has a magnetic scale and magnetoresistance devices, an optical encoder, or the like.

The interpolation circuit includes a phase angle detecting circuit 1, a data updating circuit 2, an integrating circuit 3, an integrating circuit 5, a two-phase square wave generating circuit 5 and a clock generator 7. The clock generator 7 generates a first clock CK1 period of which is PCK1 and a second clock CK2 period of which is PCK2. The second clock CK2 is synchronized with the first clock CK1 and has a higher frequency than the first clock CK1. The phase angle detecting circuit 1 samples the two-phase sinusoidal signals INA and INB by the first clock CK1, and digital-processing the sampled values to detect phase angle data PH of the two-phase sinusoidal signals INA and INB. The data updating circuit 2 stores the current phase angle data CNT and sequentially updates the current phase angle data CNT by use of the subsequent phase angle data PH for each period of the first clock CK1. The integrating circuit 3, which serves as a pulse dispersing circuit for uniformly dispersing the interpolation timing pulses, stores and then integrates the differential data DX by the second clock CK2. The differential data DX is a differential between the current phase angle data CNT and the subsequent phase angle data PH. The integrating circuit 3 generates a carry signal for each data range M(=PCK1/PCK2). For detecting the carry, a carry detecting circuit 4 is disposed. The square wave generating circuit 5 generates two-phase square wave signals OUTA and OUTB which rise or fall at every timings of the carry detecting signals QUADEN. The counting direction of the output data OUTA and OUTB is defined by the polarity of the differential data DX. In this embodiment, an over-speed detecting circuit 6 is disposed to monitoring the differential data DX, and determining the over-speed state.

The phase angle detecting circuit 1 has sample-and-hold circuits 11a and 11b for sampling and holding the two-phase sinusoidal signals INA and INB by the first clock CK1, A/D converters 12a and 12b for converting the sampled values to digital data, and a look-up table memory 13 for outputting phase angle data based on the digital data from the A/D converters 12a and 12b. The look-up table for outputting the phase angle data PH has been stored based on the above-described equation (1). The phase angle data PH output from the look-up table memory 13 are sequentially stored in a first register 14 driven by the first clock CK1.

The data updating circuit 2 has a second register 27 which is driven by the first clock CK1 to store a current phase angle data CNT. The current data CNT stored in the second register 27 is subtracted from the subsequent phase angle data PH stored in the first register 21 in a subtracter 21, whereby the differential data DX is obtained. The absolute and polarity of the differential data DX is taken in an absolute detecting circuit 22 and a polarity detecting circuit 23, respectively. The absolute data is input to a limiter 24 to output a differential data DELTA1 the upper limit of which is predetermined. The upper limit LMT for the differential data DX is set to be M=PCK1/PCK2 or less in the limiter 24. A polarity adding circuit 25 adds the polarity data POL output from the polarity detecting circuit 23 to the differential data DELTA1 to outputs absolute differential data DELTA2. The differential data DELTA2 is added to the current phase angle data CNT in an adder 26, and the resulting data S1 is stored in the second register 27. In other words, the current data CNT is fed-back to the subtracter 21 to be subtracted from the subsequent phase angle data PH, thereby outputting the differential data DX. Based on the differential data DX, the current data CNT is updated for each clock CK1.

The above-described phase angle conversion and phase angle data updating operation will be described in detail by use of an example below. Assuming that PCK1 is 200 ns(=5 MHz), and PCK2 is 25 ns(=40 MHz), period ratio thereof is M=PCK1/PCK2=8. In this embodiment, the ratio M serves as the upper limit LMT in the limiter 24. When the differential data DX=−10 is obtained by the subtracter 21, data DELTA1=8 is output of the limiter 24, and the polarity data POL output from the polarity detecting circuit 23 is "negative", whereby the data DELTA2=−8 is output from the polarity adding circuit 25. Therefore, the current data CNT is repeatedly updated within the upper limit LMT=8.

In more detail, assume that the interpolation number is INP=400. In this case, the correlation between the revolution R of the two-phase square wave output OUTA and OUTB and the wavelength of the two-phase sinusoidal signals INA and INB is defined as the following equation (2).

$$R = \lambda / INP \tag{2}$$

When $\lambda=4$ μm and INP=400, the revolution R is as R=4 μm/400=0.01 μm. Assuming that the revolution of each of the A/D converter 12a and 12b is 10 bits, 20 bits addresses are necessary for the look-up table memory 13. The data range of the phase angle data PH which is converted in the memory 13 is equal to the interpolation number INP. That is, the phase angle data PH is in the range of 0 to 399. The minimum value of the phase angle data PH (i.e., 1LSB) corresponds to 360°/INP=0.9

The following table 1 is an algorithm example for showing the current phase angle data CNT is updated by the subsequent phase angle data PH in the cycles 1 to 4 of the first clock CK1.

TABLE 1

| CYCLE | CNT | PH | CX | DELTA1 | POL | S1 |
|-------|-----|-----|-----|--------|-----|-----|
| 1 | 200 | 200 | 0 | 0 | 0 | 200 |
| 2 | 200 | 198 | −2 | 2 | − | 198 |
| 3 | 198 | 188 | −10 | 8 | − | 190 |
| 4 | 190 | 192 | +2 | 2 | + | 192 |

The example in the table 1, shows such a case that the initial value of the current data CNT is 200, and the subsequent phase angle data PH=200 is output in the cycle 1. In the cycle 1, the current data CNT is not changed. in the cycle 2, the phase angle data PH=198 is obtained due to the encoder movement. In this cycle 2, the differential data is; DX=−2, and the absolute differential data is; DELTA1=2. As a result, the data S1 which is to be added to the current data CNT is −2+200=198. This value becomes the current data CNT in the following cycle 3. When the phase angle data PH=188 is output in the cycle 3, the differential dat DX=−10 is obtained, thereby the absolute differential data DELTA1 is limited to the upper limit LMT=8. The example of the cycle 4 shows that the phase angle data PH=192, which is larger than the current data, is output. In this cycle 4, the data S1 is equal to the phase angle data PH. Therefore, although the updated value shows an instantaneously insufficient state in the cycle 3, the lack of the updated value can be filled up in the cycle 4.

When a to-update value is under the upper limit LMT, the data updating can be perfectly performed in one period of the first clock CK1. For satisfying such a condition, it is necessary that the encoder velocity V satisfies the following expression (3).

$$V \leq LMT \times R / P_{CK1} \tag{3}$$

$$= 8 \times 0.01 \, [\mu m] / 200 \, [ns]$$

$$= 400 \, [mm/s]$$

In this embodiment, even if the feed velocity V is momentarily over 400 mm/s, the current data CNT can be automatically restored to a true value, because of the above-described feedback control. If the over-speed state of V>400 mm/s continues, and the differential data DX increases over a predetermined value, an operation error occurs due to that one cycle later current data is fed-back. In the above-described example, the operation error occurs when the absolute of the differential data DX is over 200. Therefore, the expression (3) defines the maximum feed velocity under which the interpolation circuit is continuously responsible.

Next, the integrating circuit 3 for interpolation pulse dispersing by use of the differential data DELTA1, the upper limit of which is predetermined, and the polarity data POL will be described in detail. The integration circuit 3 has a third register 31 for storing the differential data DELTA1, an adder 32 and a fourth register 33 for accumulating the data DELTA1 in the register 31 and storing the resultant by the second clock CK2. The second clock CK2 is synchronized with the first clock, and has a higher frequency than the first clock CK1. The fourth register 33 is reset by the first clock CK1. Therefore, the differential data DELTA1 obtained in a first clock period is multiplied by integrals, which increase for each second clock period, in the following first clock period.

The carry detecting circuit 4 generates carry detecting signals QUADEN every when the integrated value INTPCNT leads to the above-described period ratio M. The number of the carry detecting signals QUADEN corresponds to the size of the differential data DELTA1. Then the carry detecting signals QUADEN serve as interpolation timing signals.

Figure 2:
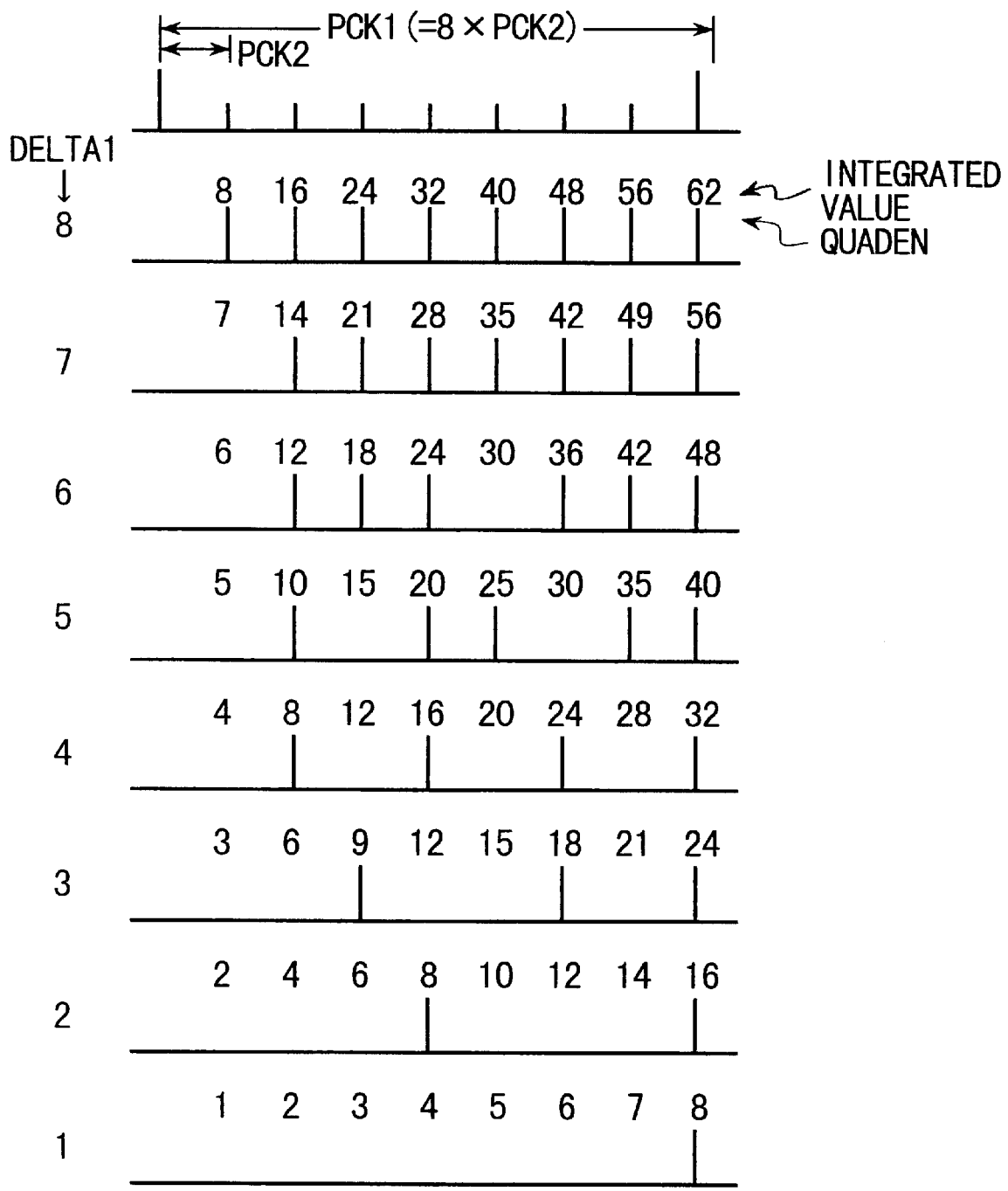
FIG. 2 shows the carry detecting signal output of the interpolation circuit.

In detail, FIG. 2 shows an example of generation of the carry detecting signals QUADEN with the integrated values which change corresponding to the differential data DELTA1 in one period of the first clock CK1, in the condition of M=LMT=8. It is appreciated that when the differential data DELTA1 is 8, the carry detecting signals QUADEN are generated at every second clock timing, whereby the carry detecting signals QUADEN are uniformly distributed in the first clock period, even when the differential data DELTA1 is small. This is a result of the integration operation for the differential data DELTA1 is performed under such a condition that the upper limit LMT is set to be M in the data updating circuit 2.

Figure 13:
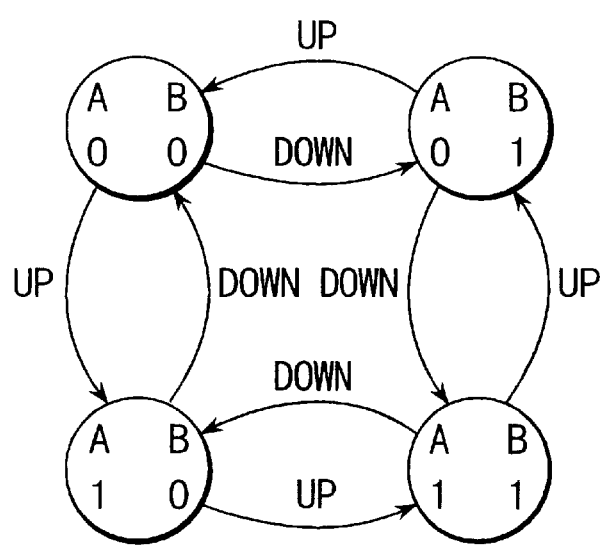
FIG. 13 shows the state transition of the two-phase square wave data generating circuit.

The two-phase square wave data generating circuit 5 generates the two-phase square wave signals OUTA and OUTB at every timings of the carry detecting signals QUADEN with a counting direction defined by the polarity data POL, corresponding to the state transition shown in FIG. 13.

The following table 2 shows an example of the integrated value INTPCNT, the carry detecting signals QUADEN and the external counter value in the case that the differential data DELTA1=1, 5, and 3 are obtained for the respective cycle K, K+1, and K+2 of the first clock CK1, respectively.

TABLE 2

| CK1 | DEL-TA1 | POL | CK2 | INTPCNT | QUADEN | EXT. COUNTER |
|---|---|---|---|---|---|---|
| K | 1 | + | INITIAL | 0 | | |
| | | | 1 | 1 | 0 | 0 |
| | | | 2 | 2 | 0 | 0 |
| | | | 3 | 3 | 0 | 0 |
| | | | 4 | 4 | 0 | 0 |
| | | | 5 | 5 | 0 | 0 |
| | | | 6 | 6 | 0 | 0 |
| | | | 7 | 7 | 0 | 0 |
| | | | 8 | 8 | +1 | 1 |
| K + 1 | 5 | + | INITIAL | 0 | | |
| | | | 1 | 5 | 0 | 1 |
| | | | 2 | 10 | +1 | 2 |
| | | | 3 | 15 | 0 | 2 |
| | | | 4 | 20 | +1 | 3 |
| | | | 5 | 25 | +1 | 4 |
| | | | 6 | 30 | 0 | 4 |
| | | | 7 | 35 | +1 | 5 |
| | | | 8 | 40 | +1 | 6 |
| K + 2 | 3 | + | INITIAL | 0 | | |
| | | | 1 | 3 | 0 | 6 |
| | | | 2 | 6 | 0 | 6 |
| | | | 3 | 9 | +1 | 7 |
| | | | 4 | 12 | 0 | 7 |
| | | | 5 | 15 | 0 | 7 |
| | | | 6 | 18 | +1 | 8 |
| | | | 7 | 21 | 0 | 8 |
| | | | 8 | 24 | +1 | 9 |

When the differential data DELTA1 is 1 in the cycle K of the first clock CK1, the integrated value INTPCNT is initialized to 0 by the first clock CK1, then the integrated value INTPCNT and the differential data DELTA1 are added for each of periods 1 to 8 of the second clock CK2. For simplifying the explanation, the table 2 shows the upper digits over the data range of M=8. However, the upper digits can be omitted in the practical signal processing circuit. At the cycle 8 of the second clock CK2, the integrated value INTPCNT becomes 8, whereby the carry detecting signal QUADEN=+1 is generated. At the timing when the carry detecting signal QUADEN is generated, the two-phase square wave data is generated, whereby the external counter counts up.

As similar to the cycle K, in the cycles K+1 and K+2, at each timing when the integrated value INTPCNT is over integral times 8, the carry detecting signal QUADEN is generated.

Figure 3:
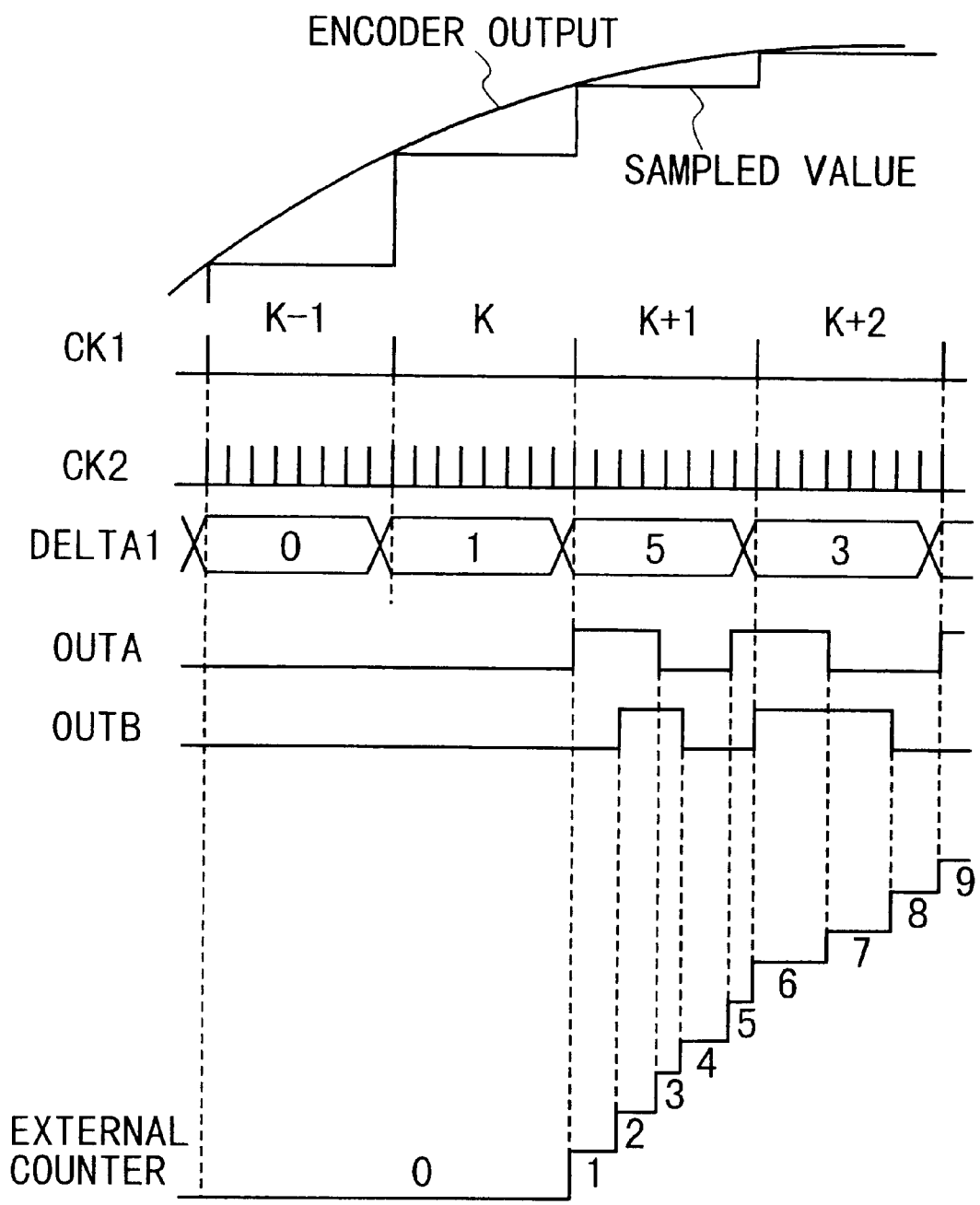
FIG. 3 shows the operation of the interpolation circuit.
Figure 14:
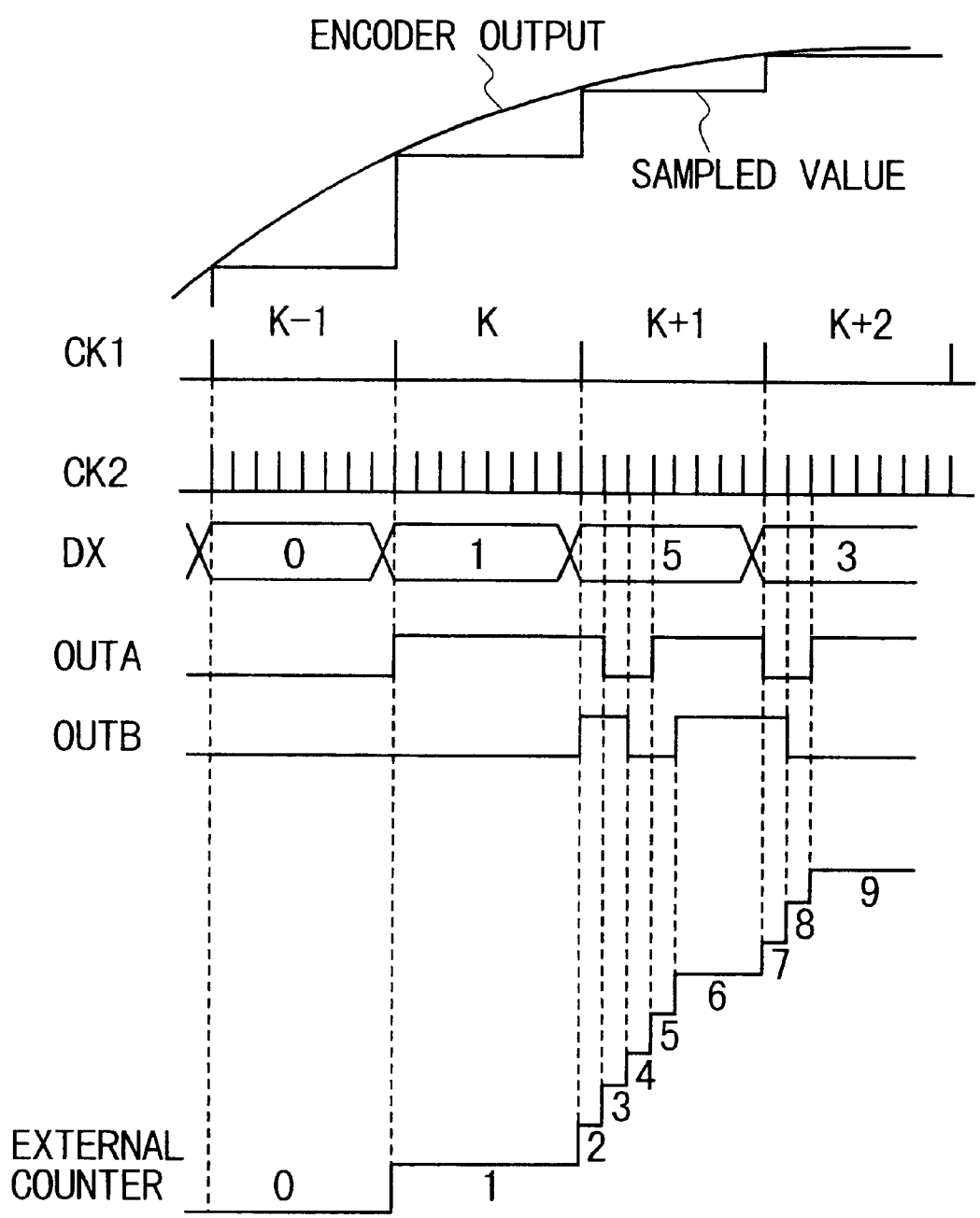
FIG. 14 shows the operation of the conventional two-phase square wave data generating circuit.

FIG. 3 shows the above-described interpolation operation, corresponding to FIG. 14. As apparent from the comparison between FIG. 3 and FIG. 14, according to this embodiment, the interpolation pulses are uniformly dispersed in the period of the first clock CK1.

As described above, according to the embodiment, the phase angle data is feedback controlled and updated by the differential data, the upper limit of the differential data is set to the ratio M between the first clock period and the second clock period, and the data range of the integrating circuit for generating the carry detecting signals is also set to M. As a result, the interpolation pulses can be uniformly distributed in the first clock period.

Furthermore, in the embodiment, even when the differential data of the phase angle data is instantaneously over the upper limit, the current data can be automatically restored to a true value by the above-described feedback mechanism. Therefore, the incremental counter can be prevented from error counting.

Additionally, in the embodiment, the differential data DX is adapted to the absolute data DELTA1, whereby the carry detecting algorithm in the integrating circuit is simplified. For example, "+7" is expresses as "0111" in binary notation, while "−7" is expressed as "1001". Since these binary expressions are not symmetric, if these binary code are used, carry detecting algorithm are different from each other. By contrast, in the present invention, the absolute of the differential data DX is taken. In this case, "+7" is expresses in combination of polarity bit "1" and "0111". Similarly, "+7" is expresses in combination of polarity bit "0" and "0111". Therefore, the same algorithm is used for both negative and positive differential data. The carry detecting is necessary for high speed for the above-described interpolation processing. In detail, in the above-described example, 4 bits adding must be performed in one period of the second clock CK2. According to the embodiment in which the above-described absolute detecting is used, the data construction is simplified, thereby high speed performance can be obtained.

Figure 4:
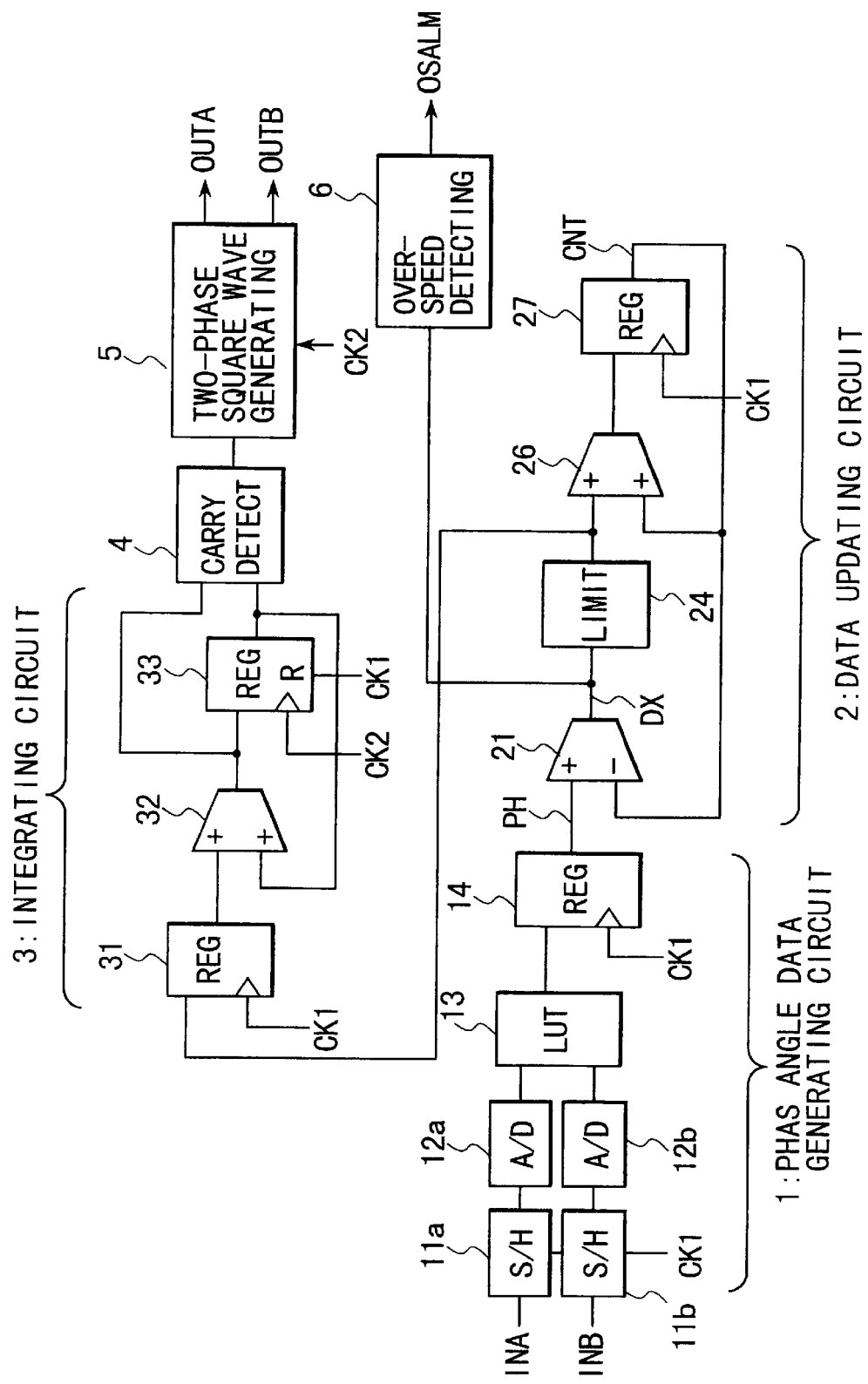
FIG. 4 shows an interpolation circuit according to another embodiment of the present invention.

However, it should be appreciated that the absolute detecting is not always necessary. FIG. 4 shows another embodiment in which the absolute detecting portion in FIG. 1 is omitted. Although the high speed processing is more difficult than the case of FIG. 1, the circuit scale is decreased. Especially, the interpolation number is large, the reduction of the circuit scale is effective.

For the look-up table memory 13, non-volatile memories, such as ROM, EPROM, EEPROM, flash memory and the like, can be used. For the arithmetic circuit portion, digital logic circuits (general-purpose gate, gate array, FPGA, and the like), programmable arithmetic circuits (DSP, incorporated micro controller, and the like), and software can be used.

For the interpolation number, the present invention is useful for a voluntary natural number of 5 or more. The interpolation number 4 can be obtained only by outputting the two-phase sinusoidal signal from the encoder. Especially, it is advantageous when $2^n$ (where, n is a natural number) is used for the interpolation circuit, because the arithmetic circuits, such as adders, can be simplified.

Furthermore, for the period ratio M between the first clock period and the second clock period, a voluntary natural number can be used. Especially, when $M=2^m$ (where, m is a natural number) is used, the circuit portion for uniformly distributing the interpolation pulses, can be simplified, whereby time delay can be reduced, and high speed performance can be obtained.

Next, the over-speed detecting circuit 6 for monitoring the differential data DX to detect the over-speed state will be described in detail.

Figure 5:
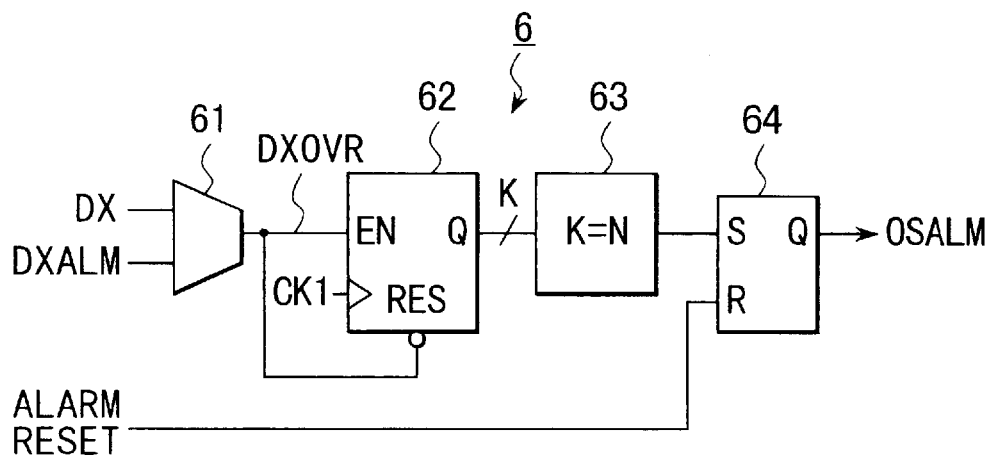
FIG. 5 shows an over-speed detecting circuit in the above embodiments.

FIG. 5 shows an example of the over-speed detecting circuit 6. The differential data DX is a tracking delay signal for a position. Therefore, in this circuit, the absolute differential data | DX | is used for over-speed detecting. A magnitude comparator 61 compares the absolute differential data | DX | with a reference value DXALM to output a over-sped signal DXOVR when | DX | is over DXALM. This is a first condition for over-speed detecting. Assuming that the first and second clocks CK1 and CK2 are 200 ns and 25 ns, respectively, clock period ratio(=8) thereof defines the maximum number of interpolation pulses. By contrast, the absolute differential data | DX | can be over 8. Therefore, reference value DXALM is set to be over 8. If the differential data | DX | is over a half of interpolation number, the automatic restoring mechanism of the interpolation circuit is disturbed. Therefore, the reference value DXALM is selected to be lower than a half of the interpolation number.

When sensitivity of the over-speed detecting is too high, alarm signals may be often generated, and then urgent stop occurs frequently. Such a situation is due to lack of signal adjustment, contamination of the encoder sensor portion, mechanical vibration, electromagnetic noise, and the like. In other words, if the two-phase sinusoidal signals INA, INB are shifted from an ideal state, such an accident that the differential data DX is instantaneously over the reference value DXALM at a spatial position in 360° may occur, in spite of that the feed speed is not over a limit. For preventing from these accidents, a second condition for the over-speed detecting is used. The second condition is to determine that the absolute differential data | DX | is subsequently over the reference value DXALM over a predetermined number N.

Considering the above-described second condition, in FIG. 5, the over-speed detecting circuit 6 has a counter 62 for counting the over-speed detecting signals DXOVR(=1), and a determining circuit 63 for determining that the count value is over N. An RS flip-flop 64 is disposed to store the determined result in the determining circuit 63 to output an over-speed alarm signal OSALM. The counter 62 is driven by the first clock CK1 to count the over-speed signals DXOVR, and reset by DXOVR=0. Therefore, under such a condition that the over-speed signals DXOVR is held to be "1" while the number of the first clocks CK1 is increased to N, the over-speed alarm signal OSALM(=1) is generated.

Figure 6:
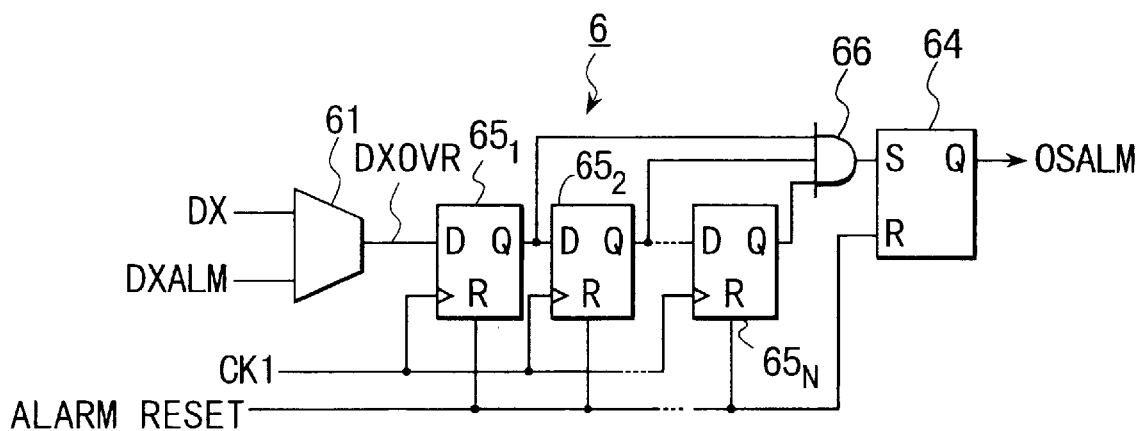
FIG. 6 shows another over-speed detecting circuit in the above embodiments.

FIG. 6 shows another over-speed detecting circuit 6 with the same detecting conditions as in FIG. 5. In this embodiment, the over-speed signals DXOVR output from the magnitude comparator 61 are sequentially stored and transferred in N-stages shift-registers 651, 652, . . . 65N. For detecting the state that all shift-registers 651, 652, . . . , 65N store "1" data, an AND gate 66 is disposed. The RS flip-flop 64 stores the output from the AND gate 66 to output the alarm signal OSALM, and is reset by an external alarm reset signal.

Figure 7:
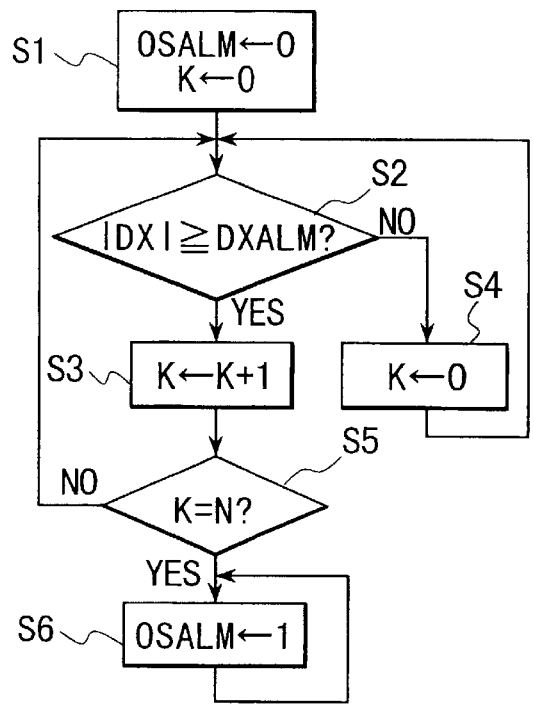
FIG. 7 shows the operation flow of the over-speed detecting circuit shown in FIG. 5 and FIG. 6.

The operation of the over-speed detecting circuits 6 shown in FIG. 5 and FIG. 6, can be performed by a software. FIG. 7 shows a flow of such the software. In initializing step S1, the over-speed alarm signal OSALM and count value K is set to be "0". In the following step S2, it is determined whether or not the differential data | DX | is over DXALM. If "YES", control jumps to step S3 where the count value K is counted up. If "NO" in step S2, control jumps to step S4 where the count value K is initialized. In step S5, it is determined whether or not the count value K reaches to N. If "NO, control loops back to step S2, whereby the same operation is repeated. If "YES" in step S5, in step S6, the over-speed alarm signal OSALM (=1) is output.

The advantageous effect of the embodiment will be described bellow, based on a detailed experimental example. The experimental conditions are as follows: The A/D converters 12a and 12b are 10 bits converters, respectively; interpolation number is 40; the input range of each of the A/D converter 12a and 12b is 2.6 V±1.0 V; and the two-phase sinusoidal signals INA and INB are provided under the conditions C1 to C4 shown in the following table 3. In the table 3, a sinusoidal signal is expressed as a±b ( where a; central voltage[V], b;amplitude[V]). In the column of INB, each the parenthesized angle is a phase difference from INA.

TABLE 3

|    | INA          | INB              |
|----|--------------|------------------|
| C1 | 2.50 ± 0.70  | 2.50 ± 0.60(85°) |
| C2 | 2.50 ± 0.70  | 2.50 ± 0.60(95°) |
| C3 | 2.55 ± 0.70  | 2.55 ± 0.60(95°) |
| C4 | 2.60 ± 0.80  | 2.60 ± 0.80(90°) |

Figure 8:
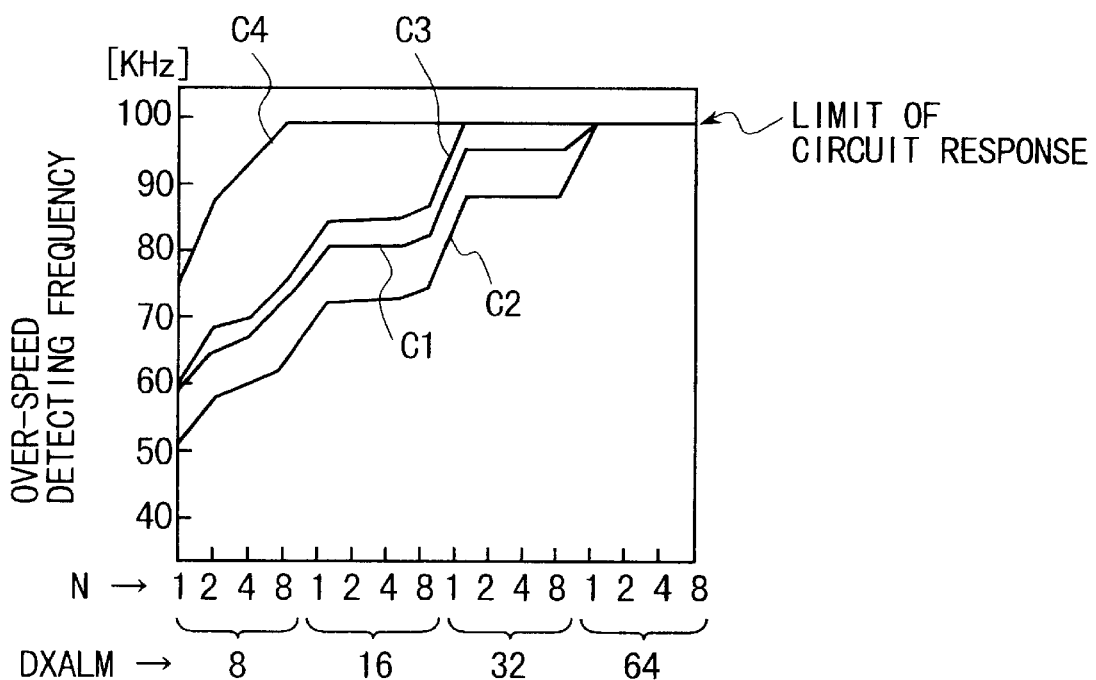
FIG. 8 shows a performance test result for the over-speed detecting circuit.

FIG. 8 shows an experimental result for the input conditions C1 to C4 in the table 3, when the reference value DXALM and the count value N are set to be various values. As shown in FIG. 8, it is appreciated that when DXALM= 64, and N=1, 2, 4, or 8, the over-speed can be determined for every conditions C1 to C4 within the circuit response limit of 100 kHz. Otherwise, due to which of the conditions C1 to C5 is selected, the over-speed alarm may be generated under 100 kHz. Therefore, it is not possible to precisely determine the over-speed.

Figure 9:
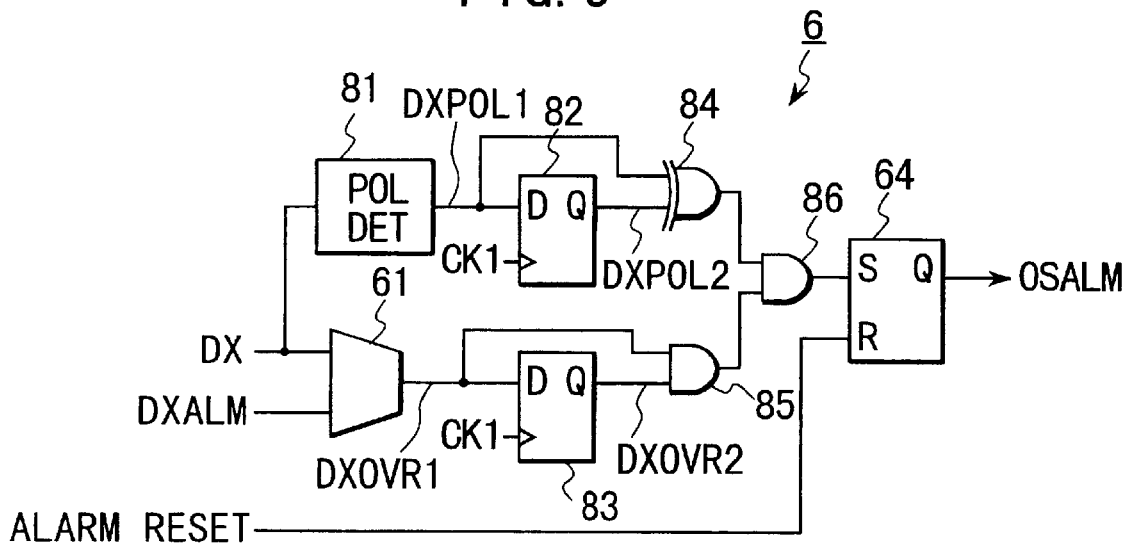
FIG. 9 shows another over-speed detecting circuit in the above embodiments.

FIG. 9 shows another over-speed detecting circuit 6. The principle of this over-speed detecting circuit 6 is to detect the polarity inversion of the differential data DX when the circuit leads to tracking impossibility. As above-described, in the interpolation circuit according to the embodiment, instantaneous over-speed state does not lead to error. In detail, when the interpolation number is 400, the state of the differential data DX of; −199≦DX≦199 (i.e., within 180° delay), can be compensated by the feedback mechanism. However, If the over-speed state continues, and then the differential data DX is out of the above-described range, the circuit operates to be locked with one clock delayed value. At this timing, the polarity of the differential data DX is inverted. In the circuit 6 of FIG. 9, the polarity inversion serves as a condition of the over-speed detecting.

The magnitude comparator 61 is, as similar to FIG. 5 and FIG. 6, used for detecting that the differential data | DX | is over the reference value DXALM. For storing the over-speed signal DXOVR output from the magnitude comparator 61, a flip-flop 83 which is driven by the first clock CK1 is used. An AND gate 83 is disposed for detecting that the current over-speed signal DXOVR1 coincides with the one clock delayed over-speed signal DXOVR2 to output "1". Further, for detecting the polarity inversion, a polarity inversion detecting circuit 82 is disposed at the input terminal of the differential data DX. The polarity inversion detecting circuit 81 output such a polarity data DXPOL1 that DXPOL1 is "1" when DX≧0, or "0" when DX<0. A second flip-flop 82 stores the polarity data DXPOL1 synchronously with the first clock CK1. An EXOR gate 64 is disposed to detect that the current polarity data DXPOL1 disaccords with the one clock delayed polarity data DXPOL2.

Figure 10:
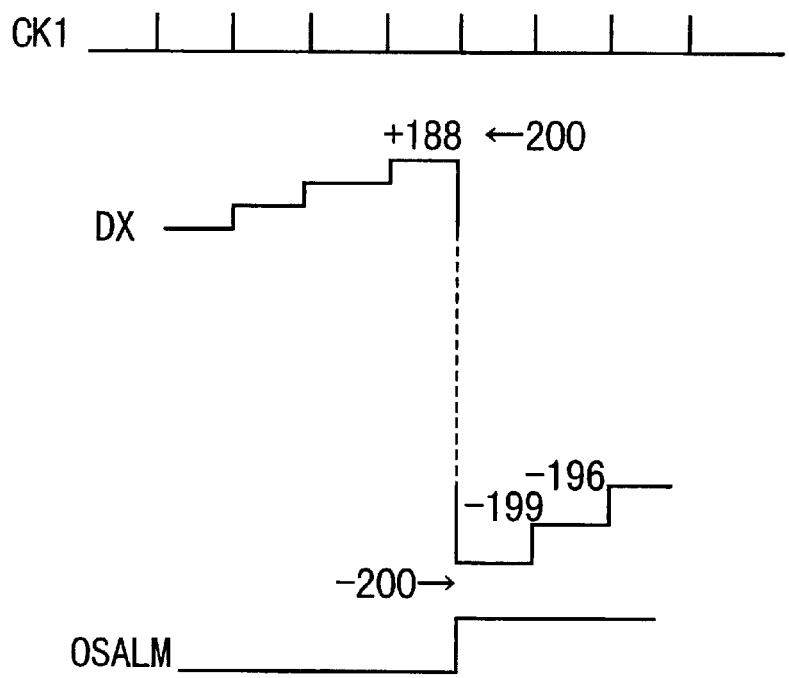
FIG. 10 shows the operation of the over-speed detecting circuit shown in FIG. 9.
Figure 11:
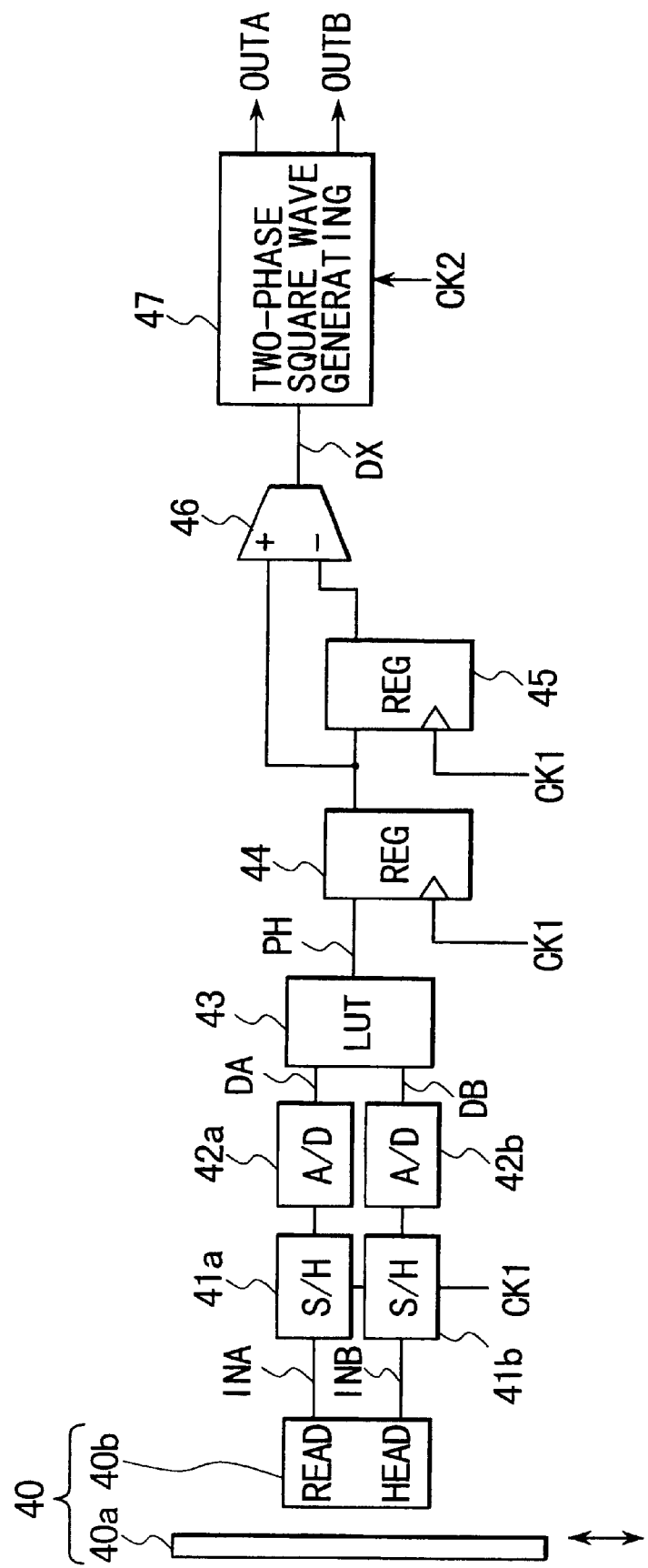
FIG. 11 shows a conventional interpolation circuit.
Figure 12:
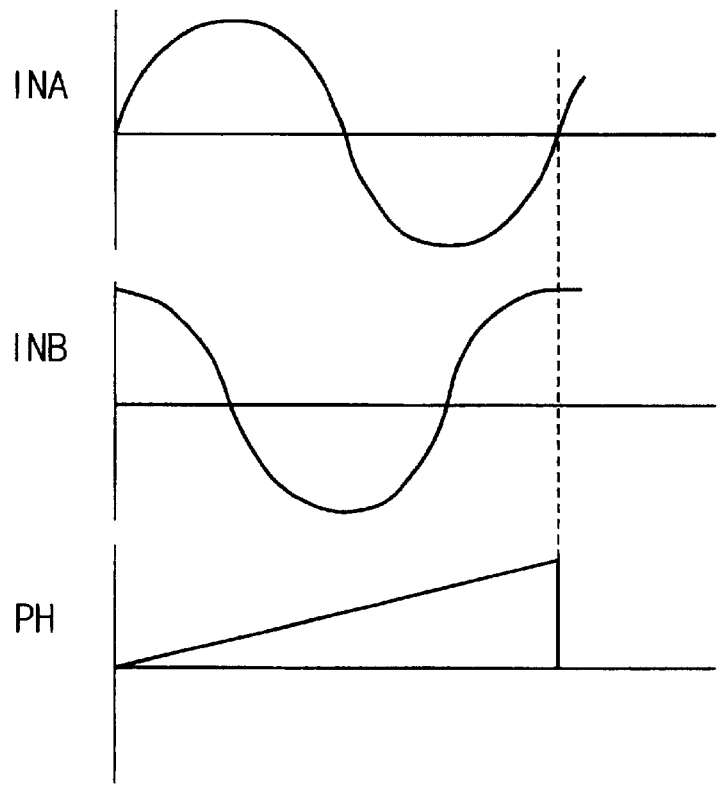
FIG. 12 shows the relationship between the two-phase sinusoidal signals and the phase angle data.

For example, as shown in FIG. 10, when the differential data DX increases in positive direction to go over 200, the polarity of the differential data DX is inverted. Both of the absolute differential data | DX | before and after the polarity inversion are so large as to go over the reference value DXALM. Under this condition, both of the over-speed signal DXOVR1 and DXOVR2 are "1", and the resulting state is detected by the AND gate 85. The polarity inversion is detected by the EXOR gate 84. A second AND gate 86 detects the coincidence of the output of the AND gate 85 and the EXOR gate 84. Therefore, one clock tracking delay due to the over-speed state can be detected under the condition of that the over-speed signals DXOVR continues as "1", thereunder the polarity of the differential data DX is inverted. The flip-flop 64 stores the output of the AND gate 86 to output the over-speed alarm signal OSALM(=1).

As above-described, according to the embodiment, by monitoring the differential data of phase angle data in the interpolation circuit, it is able to surely detect the over-speed state in spite of when the sinusoidal signals are slightly disturbed. Especially, the over-speed detecting circuit 6 shown in FIG. 5 and FIG. 6 does not detect the over-speed state until the encoder velocity leads to about the limit frequency which corresponds to the maximum feed velocity. Additionally, these over-speed detecting circuit 6 shown in FIG. 5 and FIG. 6 can prevent from frequent generation of the over-speed alarm signal due to the instantaneous over-speed states which is not erroneous. Therefore, the interpolation circuit can be provided with high speed performance and high reliability.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

The entire disclosure of Japanese Patent Application No. 8-286847 filed on Oct. 29, 1996 including specification, claims, drawings and abstract are incorporated herein by reference in its entirety.

What is claimed is:

1. An interpolation circuit for an encoder, comprising:
   a clock generator which generates a first clock and a second clock, the second clock being synchronized with the first clock and having a higher frequency than the first clock;
   a phase angle detecting circuit which samples two-phase sinusoidal signals output from the encoder with 90° phase-shift each other by the first clock, and then digital-processes the resultant sampled values to detect phase angle of the two-phase sinusoidal signals so as to sequentially output phase angle data, each phase angle data corresponding to the respective sampling phase defined by the first clock;
   a data updating circuit which sequentially input the phase angle data output from the phase angle detecting circuit, and then updates the current phase angle data by the subsequent phase angle data in such a manner as to calculate a differential between the current phase angle data and the subsequent phase angle data, and then adds the differential data, whose upper limit is predetermined, to the current phase angle data, thereby holding sequentially updated phase angle data;
   an integrating circuit which integrates the differential data by the second clock to hold the integrated value which is to be reset by the first clock;
   a carry detecting circuit which detects that the integrated value is over the ratio of the first clock period to the second clock period to output a carry detecting signal; and
   a two-phase square wave generating circuit which generates two-phase square wave, state of which changes synchronously with the second clock at each timing of the carry detecting signal.

2. The interpolation circuit according to claim 1, wherein the phase angle detecting circuit comprises:
   a sample-and-hold circuit which samples the two-phase sinusoidal signals by the first clock and holds the sampled values;
   an A/D converter which converts the sampled values to a set of digital data;
   a look-up table memory which outputs a phase angle data based on the set of digital data; and
   a first data storing circuit which sequentially stores the phase angle data read out from the look-up table memory synchronously with the first clock.

3. The interpolation circuit according to claim 2, wherein the data updating means comprises;
   a second storing circuit which sequentially stores the phase angle as a current phase angle data which is to be updated by the subsequent phase angle data from the first storing circuit synchronously with the first clock;
   a subtracter which subtracts the current phase angle data in the second storing circuit from the subsequent phase angle data in the first storing circuit to output a differential data;
   a limiter which limits the differential data as to have an upper limit that is smaller than the ratio of the first clock period to the second clock period; and
   an adder which adds the differential data whose upper limit is predetermined to the current phase angle data in the second storing circuit, thereby updating the current phase angle data.

4. The interpolation circuit according to claim 2, wherein the data updating circuit comprises;
   a second storing circuit which sequentially stores the phase angle data as a current phase angle data which is to be updated by the subsequent phase angle data from the first storing circuit synchronously with the first clock;
   a subtracter which subtracts the current phase angle data in the second storing circuit from the subsequent phase angle data in the first storing circuit to output a differential data;
   a detecting circuit which detects the absolute and the polarity of the differential data;
   a limiter which limits the absolute of the differential data as to have an upper limit that is smaller than the ratio of the first clock period to the second clock period;
   a polarity adding circuit which adds the polarity data to the differential data whose upper limit is predetermined; and
   an adder which adds the differential data on which the polarity data is added to the current phase angle data in the second storing circuit, thereby updating the current phase angle data.

5. The interpolation circuit according to claim 1, further comprising an over-speed detecting circuit which detects over-speed state by monitoring the differential data in the data updating circuit.

6. The interpolation circuit according to claim 5, wherein the over-speed detecting circuit comprises:
   a comparator which compares the absolute of the differential data with a reference value to output a over-speed signal for each timing when the absolute of the differential data is higher than the reference value; and
   an alarm circuit which input the over-speed signals synchronously with the first clock to output an over-speed alarm signal in such a condition that the over-speed signals are subsequently output over a predetermined number.

7. The interpolation circuit according to claim 5, wherein the over-speed detecting circuit comprises:
   a comparator which compares the absolute of the differential data with a reference value to output a over-speed signal for each timing when the absolute of the differential data is higher than the reference value;

a polarity detecting circuit which detects the polarity of the differential data; and an alarm circuit which input the over-speed signals synchronously with the first clock to output an over-speed alarm signal in such a condition that the over-speed signals are subsequently output, and thereunder the polarity detecting circuit detects the inversion of the polarity of the differential data.

8. An interpolation circuit for an encoder, comprising:

a phase angle detecting circuit which sequentially detects phase angle of two-phase sinusoidal signals output from the encoder with 90° phase-shift each other by use of digital signal processing for each period of a first clock to sequentially output phase angle data, each phase angle data corresponding to the respective sampling phase defined by the first clock for sampling the two-phase sinusoidal signals;

a calculating circuit which calculates a differential between each of the phase angle data sequentially output from the phase angle detecting circuit and one period preceding phase angle data;

a time-interpolating circuit which synchronously disperses the differential data output from the calculating circuit with a second clock which has a higher frequency than the first clock so as to output uniformly dispersed pulses within the first clock period; and a two-phase square wave generating circuit which generates digital two-phase square wave signals, state of which changes synchronously with the second clock at each timing of the uniformly dispersed pulses.

* * * * *